United States Patent
Inoue et al.

(10) Patent No.: US 6,710,826 B2
(45) Date of Patent: Mar. 23, 2004

(54) TWO-TERMINAL TYPE NON-LINEAR ELEMENT, MANUFACTURING METHOD AND LIQUID CRYSTAL DISPLAY PANEL

(75) Inventors: Takashi Inoue, Nagano-ken (JP); Yasushi Takano, Nagano-ken (JP); Hideaki Naono, Nagano-ken (JP); Wataru Ito, Nagano-ken (JP); Tsutomu Asakawa, Nagano-ken (JP); Takeyoshi Ushiki, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 69 days.

(21) Appl. No.: 10/095,688

(22) Filed: Mar. 13, 2002

(65) Prior Publication Data

US 2002/0093601 A1 Jul. 18, 2002

Related U.S. Application Data

(63) Continuation of application No. 09/002,954, filed on Jan. 5, 1998, now Pat. No. 6,384,880.

(30) Foreign Application Priority Data

Jan. 6, 1997 (JP) ............................................. 9-011790

(51) Int. Cl.[7] .............................................. G02F 1/136
(52) U.S. Cl. .......................................... 349/51; 349/52
(58) Field of Search .............................. 349/51, 52, 49, 349/187; 257/59, 72, 41, 411

(56) References Cited

U.S. PATENT DOCUMENTS

| 5,128,784 A | 7/1992 | Suzuki et al. |
| 5,236,573 A | 8/1993 | Shannon et al. |
| 5,485,294 A | 1/1996 | Sugiyama et al. |
| 5,719,647 A | 2/1998 | Fujikawa et al. |
| 5,994,748 A | 11/1999 | Inoue et al. |

FOREIGN PATENT DOCUMENTS

| JP | 52-149090 | 12/1977 |
| JP | 57-122478 | 7/1982 |
| WO | WO-94/18600 | 8/1994 |
| WO | WO9630953 | 10/1996 |

Primary Examiner—Toan Ton
(74) Attorney, Agent, or Firm—Oliff & Berridge, PLC

(57) ABSTRACT

The present invention provides a MIM type non-linear element in which the capacitance is sufficiently small and in which little changes over time are exhibited in the current-voltage characteristics, a liquid crystal display panel with high image quality using the MIM type non-linear element, and a method of manufacturing the MIM type non-linear element. The MIM type non-linear element includes a first conductive film, an insulation film and a second conductive film, which are laminated on a substrate. The insulation film has a relative dielectric constant of 25.5 or less, preferably 24.0–25.5. In elementary analysis by SIMS, a hydrogen spectrum of the boundary region between the first conductive film and the insulation film has a width of 10 nm or more in the depth direction at an intensity of one tenth of the peak intensity. The first conductive film of the MIM type non-linear element shows a peak temperature of 300° C. or higher in a thermal desorption spectroscopy of hydrogen. The MIM type non-linear element is manufactured by, for example, a method containing the steps of (a) forming the first conductive film, (b) heat-treating the first conductive film at a temperature of 300° C. or higher in an inert gas, (c) forming the insulation film on the surface of the first conductive film by anodization of the first conductive film, and (d) forming the second conductive film on the surface of the insulation film.

2 Claims, 14 Drawing Sheets

TWO-TERMINAL TYPE NON-LINEAR ELEMENT, MANUFACTURING METHOD AND LIQUID CRYSTAL DISPLAY PANEL

This is a Continuation of application Ser. No. 09/002,954 filed Jan. 5, 1998, now U.S. Pat. No. 6,584,880. The entire disclosure of the prior application is hereby incorporated by reference herein in its entirety.

BACKGROUND OF THE INVENTION

1. Field of Invention

The present invention relates to a two-terminal type non-linear element used as a switching element, a method of manufacturing the two-terminal type non-linear element, and a liquid crystal display panel containing the two-terminal type non-linear element.

2. Description of Related Art

In an active matrix type liquid crystal display device, the space between an active matrix substrate containing switching elements provided for respective pixel regions to form a matrix array, and an opposite substrate containing, for example, color filters, is filled with a liquid crystal, and the alignment state of the liquid crystal in each of the pixel regions is controlled to display predetermined image data. For each of the switching elements, a three-terminal element such as a thin film transistor (TFT), or a two-terminal type element such as a metal-insulator-metal (MIM) non-linear element (referred to as a "MIM element" hereinafter) is generally used. The switching element having the two-terminal type element is excellent in that no cross-over short circuiting occurs, and the manufacturing process can be simplified, as compared with the three-terminal element.

In a liquid crystal display device containing the MIM elements, in order to realize a liquid crystal display panel which exhibits high image quality and high contrast in which unevenness in the display, after image phenomenon and sticking image phenomenon are not observed, it is important to satisfy the following conditions for the characteristics of the MIM element:

(1) The capacitance of the MIM element is sufficiently smaller than that of the pixel of the liquid crystal display panel;

(2) Changes in the current-voltage characteristics of the MIM element with respect to time are sufficiently small;

(3) The current-voltage characteristics of the MIM element have good symmetry;

(4) The current-voltage characteristics of the MIM element have sufficiently high steepness; and (5) The element resistance of the MIM element is sufficiently uniform in a wide voltage range.

Namely, in order to increase the contrast, it is necessary that the capacitance of the MIM element be sufficiently small, as compared with the capacitance of the liquid crystal display panel which contains capacitances of one pixel electrode, a liquid crystal which is provided in the region driven by the pixel electrode, and a signal line provided opposite to the pixel electrode.

Also, in order to increase the contrast, the current-voltage characteristics of the MIM element should have sufficiently high steepness. In order to make the unevenness in the display unrecognizable, it is necessary for the MIM element to have sufficiently uniform resistance in a wide voltage range. In order to make the after image unrecognizable, it is necessary for the MIM element to show sufficiently small changes in the current-voltage characteristics with respect to time. Further, in order to make the sticking image unrecognizable, it is necessary for the MIM element to exhibit current-voltage characteristics having sufficiently small changes with respect to time and having good symmetry.

The "after image" is the phenomenon in which a first displayed image is observed when the display screen is switched to display a second image, and the first displayed image disappears in a short time. The "image sticking" is the phenomenon in which a first image is displayed over a long period of time, the display screen is switched to display a second image, and the first image is observed for a long time. The observed first image of the latter phenomenon will be referred to as the "sticking image". Further, the phrase "the current-voltage characteristics have good symmetry" means that there is a sufficiently small difference between the absolute values of currents at a given voltage when a current is passed from a first conductive film to a second conductive film and when a current is passed from the second conductive film to the first conductive film.

Types of MIM elements have previously been proposed. For example, Japanese Patent Unexamined Publication No. 52-149090 proposes an MIM element containing a first conductive film of tantalum, an insulation film containing a metal oxide film formed by anodization of the first conductive film, and a second conductive film of chromium formed on the surface of the insulation film. Since the insulation film is formed by anodization of the surface of the first conductive film, the insulation film is formed with a uniform thickness without pinholes. Japanese Patent Unexamined Publication No. 57-122478 proposes that a dilute aqueous solution of citric acid is used as electrolyte for anodization. In these techniques, the characteristics (2) to (5) of the MIM element are not always sufficiently good.

Namely, the changes with respect to time, the symmetry and the steepness of the current-voltage characteristics are insufficient, and the element resistance is not sufficiently uniform in a wide voltage range. Therefore, a liquid crystal display panel containing the MIM elements has a problem in that it is difficult to maintain high contrast in a wide temperature range in the panel, and it easily brings about unevenness in the display.

International Patent Application PCT/JP94/00204 (International Laid-Open No. WO94/18600) proposes a structure in which a tantalum alloy film containing tungsten is used as a first conductive film of an MIM element. In this technique, since the first conductive film of the MIM element contains not a single tantalum film but an alloy film of specific elements such as tantalum and tungsten, the characteristics (2) and (3), i.e., the changes with respect to time and symmetry of the current-voltage characteristics of the MIM element, are improved as compared with the techniques previously discussed with respect to Japanese Patent Unexamined Publication Nos. 52-149090 and 57-122478. In addition, the after image can be decreased to an unrecognizable level, and the contrast can be kept high in a wide temperature range. However, this technique does not provide sufficiently high contrast at high temperatures, and, as such, cannot be used in applications requiring high contrast at high temperatures.

SUMMARY OF THE INVENTION

An object of the present invention is to provide a two-terminal type non-linear element exhibiting the characteristics (1) to (5) required for the MIM element described above. In particular, the MIM element should exhibit steepness of the current-voltage characteristics, sufficiently small changes in the current-voltage characteristics with respect to time, and high reliability.

Another object of this invention is to provide a liquid crystal display panel containing the two-terminal type non-linear element, exhibiting high contrast and high image quality, and causing neither unevenness nor sticking image in the display.

A further object of the present invention is to provide a method of manufacturing the two-terminal type non-linear element having the above described excellent characteristics.

In accordance with the present invention, a two-terminal non-linear element (referred to as a "MIM type non-linear element" hereinafter) contains a first conductive film, an insulation film and a second conductive film, which are laminated on a substrate. The insulation film is obtained by anodization of the first conductive film in a electrolyte containing a water solution. The insulation film has a relative dielectric constant of 25.5 or less, and preferably a relative dielectric constant of 24.0–25.5.

In an MIM type non-linear element of the present invention, a hydrogen spectrum of the boundary region between the first conductive film and the insulation film is obtained by elementary analysis carried out by secondary ion-mass spectrography (SIMS) using irradiation of cesium primary ions. The hydrogen spectrum in the depth direction preferably has a width of 10 nm or more, more preferably a width of 15–50 nm, at an intensity of one tenth of the peak intensity.

In accordance with the present invention, in an MIM type non-linear element, a thermal desorption spectroscopy of the first conductive film preferably has a peak temperature of the hydrogen spectrum of 300° C. or higher, more preferably a peak temperature of 300–400° C.

In the MIM type non-linear element of the present invention, the second conductive film is not limited to a metallic film, and includes transparent conductive films of ITO and the like.

In an MIM type non-linear element of the present invention, in particular, the capacitance of the MIM type non-linear is sufficiently small, and the steepness of the voltage-current characteristic is large. In addition, in the MIM type non-linear element of the present invention, it is possible to have extremely small changes in voltage-current characteristics over the passage of time. Also, the MIM type non-linear element of the present invention can maintain high reliability over a long period of time. In the MIM type non-linear element of the present invention, the insulation film is possibly divided into three layers including upper and lower semiconductor layers adjacent to the first and second conductive films, and an insulator layer formed between the two semiconductor layers, with the insulator layer having a band gap larger than that of the semiconductor layers. One possible reason for the changes in the current-voltage characteristics with respect to time is that the fine crystal of the insulator layer is gradually broken by the application of a voltage. In the MIM type non-linear element of the present invention, the semiconductor layer containing hydrogen and having a specified thickness is present between the insulator layer and the conductive films, particularly the first conductive film, thereby decreasing the effective voltage applied to the insulator layer. As a result, changes in the current-voltage characteristics with respect to time are possibly decreased.

In accordance with the present invention, a method of manufacturing a MIM type non-linear element contains the steps of:

(a) forming a first conductive film on a substrate;
(b) heat-treating the first conductive film at a temperature of 300° C. or higher in an inert gas;
(c) forming an insulation film on the surface of the first conductive film by anodization of the first conductive film; and
(d) forming a second conductive film on the surface of the insulation film.

This manufacturing method is capable of obtaining the MIM type non-linear element of the present invention by carrying out a heat treatment step.

In accordance with the present invention, a liquid crystal display panel contains the MIM type non-linear element. More specifically, the liquid crystal display panel includes a first transparent substrate with signal lines arranged in a predetermined pattern on the first transparent substrate, MIM type non-linear elements connected to the signal lines, and pixel electrodes connected to the MIM type non-linear elements. The liquid crystal display panel further includes a second substrate containing other signal lines provided opposite to the pixel electrodes, and a liquid crystal layer sealed between the first substrate and the second substrate. This liquid crystal display panel has high contrast and causes less image sticking, and thus can display high-quality images. The liquid crystal display can be used for a wide range of applications.

DETAILED DESCRIPTION OF PREFERRED EMBODIMENTS

Preferred embodiments of the present invention will be described below with reference to the drawings.

Figure 1:
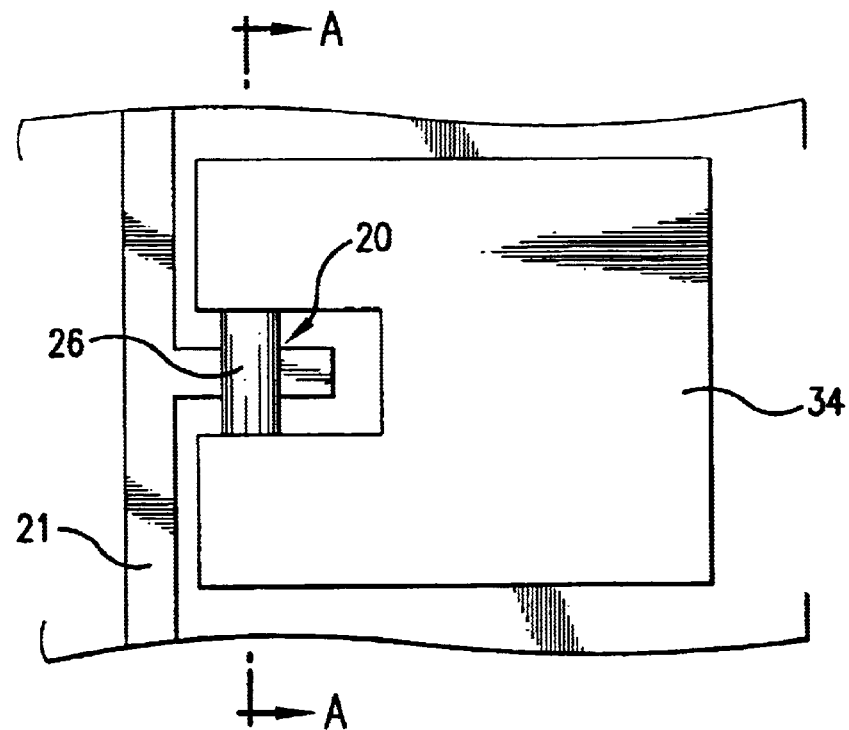
FIG. 1 is a plan view showing a principal portion of a liquid crystal display panel to which a MIM type non-linear element of the present invention is applied.
Figure 2:
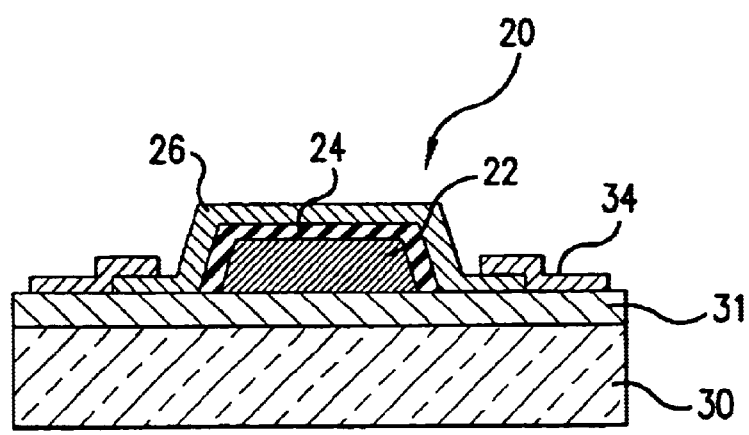
FIG. 2 is a cross-sectional view taken along line A—A in FIG. 1.

FIG. 1 is a plan view showing in schematic one unit of a liquid crystal driving electrode containing the MIM type non-linear element of the present invention. FIG. 2 is a schematic sectional view taken along line A—A in FIG. 1.

A MIM type non-linear element 20 includes a first substrate 30 having insulation capability and transparency which may be, for example, a glass or plastic substrate. MIM type non-linear element 20 further includes an insulation film 31 formed on the surface of the substrate 30, a first conductive film 22 containing tantalum or a tantalum alloy, an insulation film 24 formed on the surface of the first conductive film 22 by anodization, and a second conductive film 26 formed on the surface of the insulation film 24. The first conductive film 22 of the MIM type non-linear element 20 is connected to a signal line (scanning line) 12, and the second conductive film 26 is connected to a pixel electrode 34.

The insulation film 31 contains, for example, tantalum oxide. Since the insulation film 31 is formed for preventing peeling of the first conductive film 22 due to heat treatment carried out after deposition of the second conductive film 26, and for preventing diffusion of impurities into the first conductive film 22 from the substrate 30, the insulation film 31 is not necessarily required in cases where these problems do not occur.

The first conductive film 22 may be a single tantalum film or an alloy film containing tantalum as a main component and an element in Groups VI, VII or VIII in the Periodic Table. Preferable examples of the element added to the alloy include tungsten, chromium, molybdenum, rhenium, yttrium, lanthanum, dysprosium, and the like. Tungsten is more preferable as the element, and the content thereof is preferably 0.1–6 atomic %.

The first conductive film 22 preferably shows a peak temperature of 300° C. or higher, more preferably 300–400° C., in a thermal desorption spectroscopy of hydrogen. The method of measuring the thermal desorption spectroscopy will be described in detail later.

The insulation film 24 is formed by anodization in a electrolyte containing a water solution. Also, prior to anodization, after forming the first conductive film 22, as will be described later, heat-treating is carried out at a predetermined temperature. As a result, it is possible to make the relative dielectric constant of the insulation film 24 smaller. This relative dielectric constant is set at 25.5 or less, preferably at 24.0–25.5.

Although the composition of the second conductive film 26 is not limited, the second conductive film 26 generally contains chromium. The pixel electrode 34 includes a transparent conductive film such as an ITO film or the like.

The present invention is characterized in that the hydrogen spectrum of the boundary region between the first conductive film 22 and the insulation film 24 in the depth direction has a width of 10 nm or more, preferably 15–150 nm, at an intensity Ih which is one tenth of the peak intensity Ip. The intensity is determined by the count number of secondary ions, which is indicated in logarithmic scale. This hydrogen spectrum is obtained by elementary analysis carried out by secondary ion-mass spectrography (SIMS) using irradiation of cesium primary ions. Namely, it is important that hydrogen is present in the specified region near the boundary between the first conductive film 22 and the insulation film 24.

Figure 3:
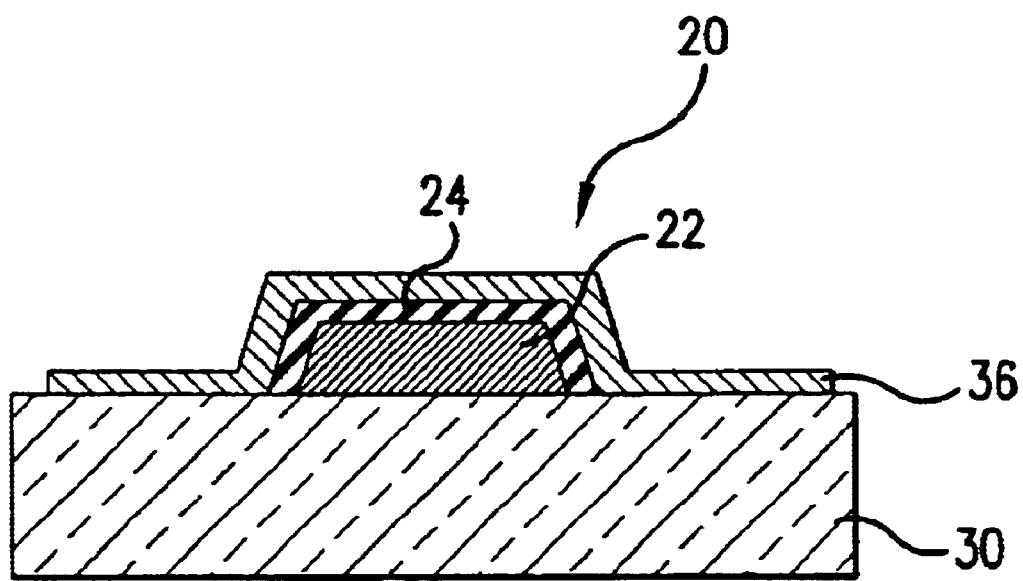
FIG. 3 is a cross-sectional view showing another example of the configuration of a MIM type non-linear element of the present invention.

As shown in FIG. 3, the second conductive film and the pixel electrode may include the same transparent conductive film 36. By forming the second conductive film and the pixel electrode by using a single film, the number of the manufacturing steps required for forming the films can be decreased.

Figure 4:
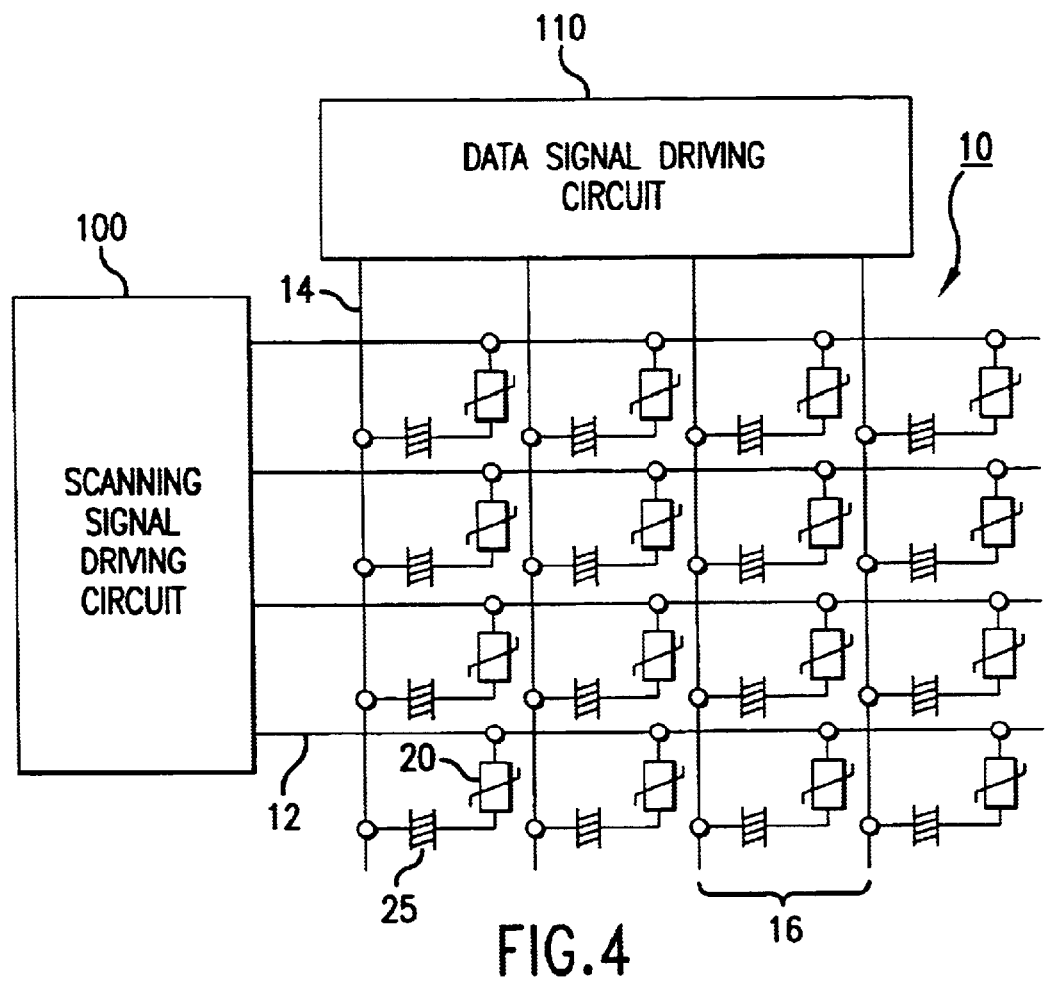
FIG. 4 shows in schematic MIM type non-linear elements in a circuit of a liquid crystal display panel of the present invention.

FIG. 4 shows an example of the circuit of active matrix type liquid crystal display panels containing the MIM type non-linear elements 20. The liquid crystal display panel 10 shown in FIG. 4 includes a scanning signal driving circuit 100 and a data signal driving circuit 110. In the liquid crystal display panel 10, a plurality of signal lines, i.e., scanning lines 12 and data lines 14, are provided so that the scanning lines 12 and the data lines 14 are driven by the scanning signal driving circuit 100 and the data signal driving circuit 110, respectively. In each of pixel regions 16, the MIM type non-linear element 20 and a liquid crystal display element (a liquid crystal layer) 25 are connected in series between a scanning line 12 and a data line 14. Although, in FIG. 4, the MIM type non-linear element 20 is connected to the scanning line 12 side and the liquid crystal display element 25 is connected to the data line 14 side, conversely, the MIM type non-linear element 20 and the liquid crystal display element 25 may be provided on the data line 14 side and the scanning line 12 side, respectively.

Figure 5:
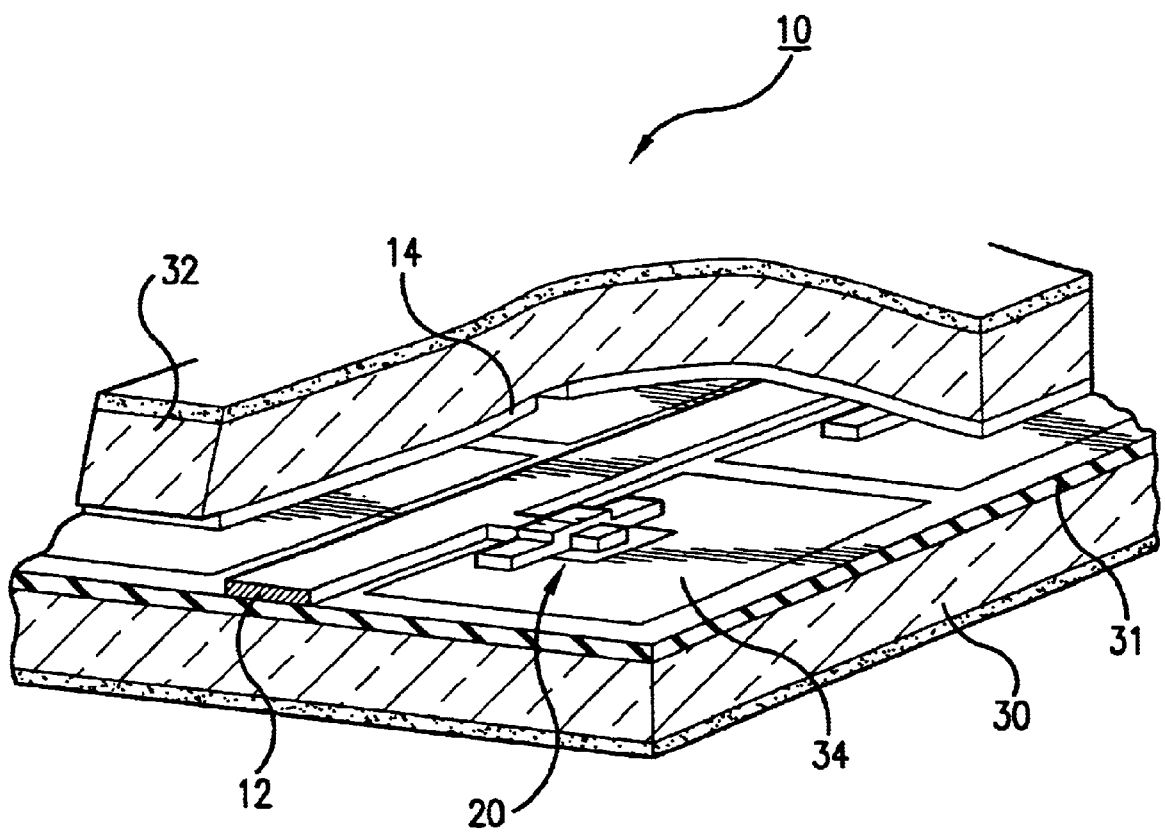
FIG. 5 is a perspective view with portions of a liquid crystal display panel shown in section.

FIG. 5 is a perspective view showing an example of the structure of the liquid crystal display panel in accordance with an embodiment of the present invention. The liquid crystal display panel 10 includes two substrates, i.e., a first substrate 30 and a second substrate 32, which oppose each other, and a liquid crystal sealed between the substrates 30 and 32 to form the liquid crystal display element 25 shown in FIG. 4. On the surface of the insulating film 31 are provided the plurality of signal lines (scanning lines) 12. On the second substrate 32 the plurality of signal lines (data lines) 14 are formed in strips to cross the scanning lines 12. Further, the pixel electrodes 34 are connected to the scanning lines 12 through the MIM type non-linear elements 20.

On the basis of the signals applied to the scanning lines 12 and the data lines 14, the liquid crystal display element 25 is switched to a display state, non-display state or intermediate state to control the display operation. As the method of controlling the display operation, a general method can be used.

Figure 6:
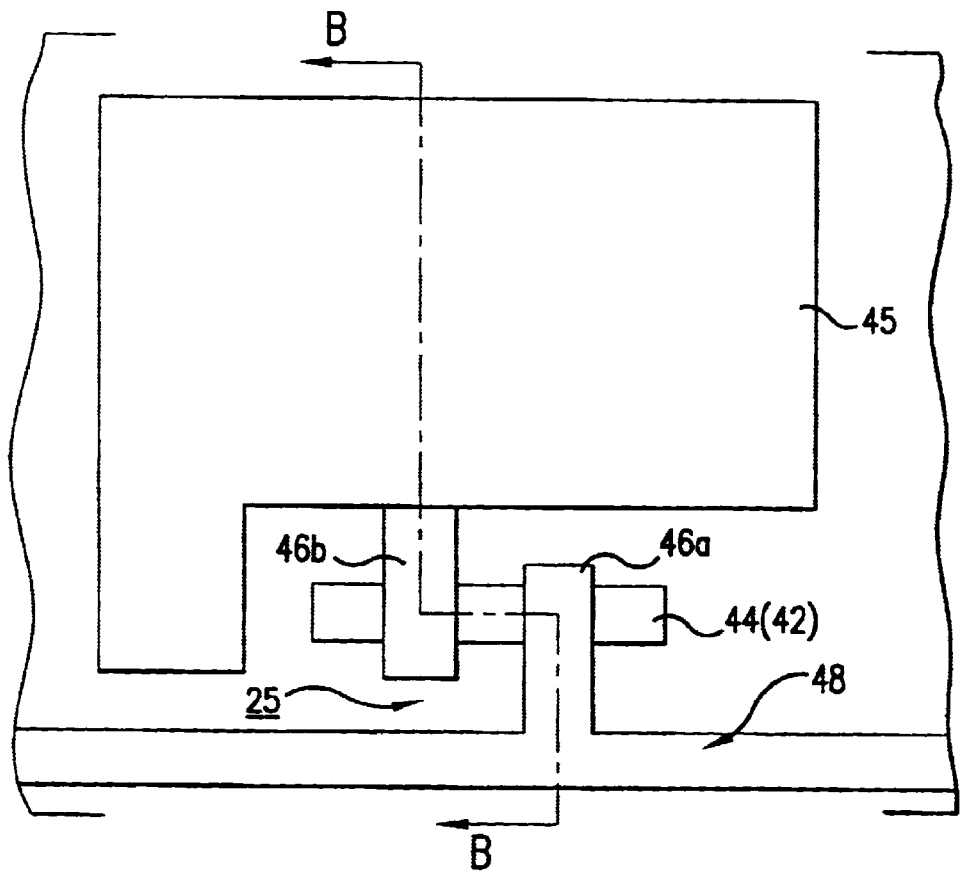
FIG. 6 is a plan view showing main elements of a liquid crystal display panel in which an MIM type non-linear element of the present invention having a back-to-back structure is applied.
Figure 7:
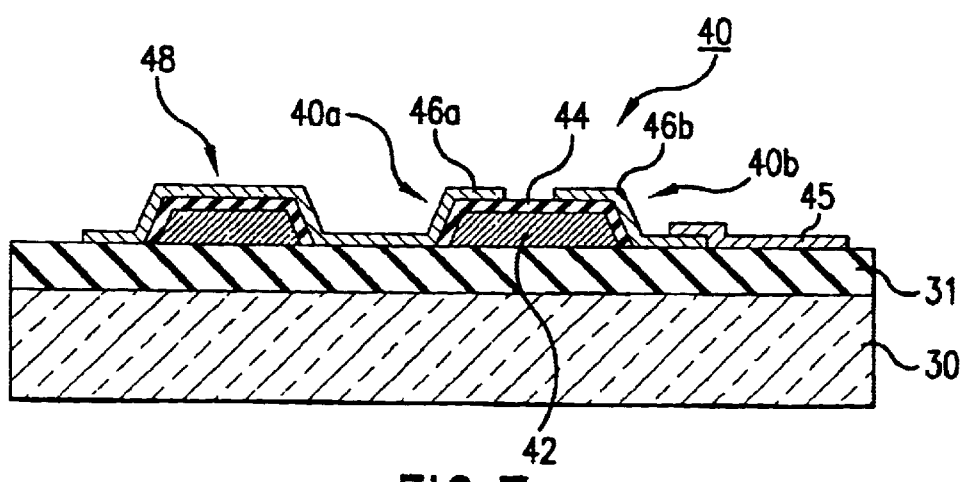
FIG. 7 is a cross-sectional view taken along line B—B in FIG. 6.

FIGS. 6 and 7 show a MIM type non-linear element in accordance with another embodiment of the present invention. FIG. 6 is a plan view schematically showing one unit of a liquid crystal driving electrode containing a MIM type non-linear element and FIG. 7 is a sectional view schematically showing the portion taken along line B—B in FIG. 6.

The MIM type non-linear element 40 shown in FIGS. 6 and 7 is different from the MIM type non-linear element 20 shown in FIGS. 1 and 2, for example, in that it has a back-to-back structure. Namely, the MIM type non-linear element 40 has a structure in which a first MIM type non-linear element portion 40a and a second MIM type non-linear element portion 40b are connected in series with opposite polarities.

Specifically, the MIM type non-linear element 40 contains a substrate 30 having insulation capability and transparency which may be, for example, a glass or plastic substrate. The MIM type non-linear element 40 further contains an insulation film 31 formed on the surface of the substrate 30, a first conductive film 42 containing tantalum or a tantalum alloy, an insulation film 44 formed on the surface of the first conductive film 42 by anodization, and two second conductive film portions 46a and 46b of the first and second MIM type non-linear element portions 40a and 40b, respectively, formed on the surface of the insulation film 44 apart from each other. The second conductive film portion 46a of the first MIM type non-linear element portion 40a is connected to a signal line (a scanning line or data line) 48, and the second conductive film portion 46b of the second MIM type non-linear element portion 40b is connected to a pixel electrode 45. The thickness of the insulation film 44 is set to be smaller than that of the insulation film 24 of the MIM type non-linear element 20 shown in FIGS. 1 and 2, for example, by about a half thereof.

Since the specified characteristics and constructions of the components of the MIM type non-linear element 40, such as the first conductive film 42, the insulation film 44 and the second conductive film portions 46a and 46b, are same as those of the MIM type non-linear element 20 disclosed above, description thereof is omitted.

The MIM type non-linear element 20 shown in FIG. 2, for example is manufactured by, for example, the following process:

First, the insulating film 31 containing tantalum oxide is formed on the substrate 30. The insulating film 31 can be formed by a method of thermally oxidizing a tantalum film deposited by, for example, sputtering or a method of sputtering or cosputtering using a tantalum oxide target. The insulation film 31 is provided for making adhesion of the first conductive film 22 closer to the substrate 30, and preventing impurity diffusion into the first conductive film 22 from the substrate 30. The insulation film 31 is formed to a thickness of 50–200 nm, for example.

On the insulation film 31, the first conductive film 22 is formed containing tantalum or a tantalum alloy. The thickness of the first conductive film 22 is appropriately selected according to application of the MIM type non-linear element, and is generally about 100–500 nm. The first conductive film can be formed by sputtering or electron beam deposition. With regard to the method of forming the first conductive film 31 containing a tantalum alloy, a sputtering or cosputtering method using a mixed target or an electron beam deposition method can be used. With regard to the element contained in the tantalum alloy, elements in Groups VI, VII or VIII in the Periodic Table, preferably elements such as tungsten, chromium, molybdenum, rhenium and the like, can be selected.

The first conductive film 22 is patterned by photolithography and etching, which are generally used. The signal lines (scanning lines) 12 are formed by the same step as the step of forming the first conductive film 22.

Next, heat treatment of the formed wafer is carried out at a temperature of 300° C. or higher, preferably 300–400° C., in an atmosphere of an inert gas, e.g., a rare gas such as argon or the like, or nitrogen gas. When the heat treatment temperature exceeds 400° C., an adverse effect is produced in the glass or plastic substrate of the wafer. Although the time required for heat treatment depends upon the thickness of the first conductive film, the heat capacitance of the annealing furnace, the number of the wafers treated, the thickness of the glass or plastic substrate of a wafer, the set temperature, etc., the time of about 10 to 120 minutes is used, for example.

By carrying out this heat treatment, as described above, it is possible to make the relative dielectric constant of the insulation film 24 smaller in comparison to a case when heat treatment is not carried out. Specifically, it is possible to set the relative dielectric constant to 25.5 or less. Further, this heat treatment enables distribution of hydrogen with a specified width (film thickness) of preferably 10 nm or more in the boundary region between the first conductive film 22 and the insulation film 24, and enables control of the hydrogen desorption temperature in the first conductive film 22.

Next, the surface of the first conductive film 22 is oxidized by anodization to form the insulation film 24. At the same time, the surfaces of the signal lines (scanning lines) 12 are oxidized to form insulation films. The preferable thickness of the insulation film 24 is selected according to application, and is, for example, about 20–70 nm. Although the composition of the chemical solution (electrolyte) used for anodization is not particularly limited, 0.01–0.1% by weight of citric acid aqueous solution, for example, can be used.

Next, a metallic film of chromium, aluminum, titanium, molybdenum or the like is deposited by sputtering, for example, to form the second conductive film 26. The second conductive film is formed to a thickness of, for example, 50–300 nm, and then patterned by photolithography and etching, which are generally used. Then, an ITO film is deposited to a thickness of 30–200 nm by sputtering or the like, followed by photolithography and etching, which are generally used, to form the pixel electrodes in a predetermined pattern.

In the MIM type non-linear element 20 shown in FIG. 3, the second conductive film and the pixel electrode is made of the transparent conductive film 36 such as the same ITO film or the like. In this case, since the second conductive film and the pixel electrode can be formed in the same step, the manufacturing process can further be simplified.

EXAMPLES

The present invention will be described in further detail below with reference to examples and comparative examples.

Example 1

In this example, a MIM type non-linear element having the back-to-back structure shown in FIGS. 6 and 7 was used. Specifically, a tantalum film containing 0.2 atomic % of tungsten was deposited to a thickness of 150 nm on a glass substrate by sputtering, and then patterned to form a first conductive film. Next, heat treatment (pre-annealing) was carried out at 350° C. for 30 minutes in a nitrogen atmosphere. Next, constant current electrolysis was carried out by using a 0.05 weight % of citric acid aqueous solution as electrolyte with a current density of 0.4 mA/cm² until a voltage of 15V was obtained. This step was followed by anodization of the tantalum film. As a result, a tantalum oxide film having a thickness of about 30 nm was formed.

Further, heat treatment was carried out at 320° C. for 30 minutes in a nitrogen atmosphere, followed by cooling in an air atmosphere to stabilize the anodized film (insulation film). Then, chromium was deposited to 100 nm on the insulation film by sputtering, and then patterned to form a second conductive film. In the first conductive film, a portion which constitute signal lines is separated to manufacture a MIM type non-linear element.

Comparative Example 1

A MIM type non-linear element was manufactured by the same method as Example 1 except that heat treatment (pre-annealing) in Example 1 was not carried out.

Examples of the experiments carried out for the MIM type non-linear elements of Example 1 and Comparative Example 1 will be described below.
(a) SIMS Example 1

Figure 8:
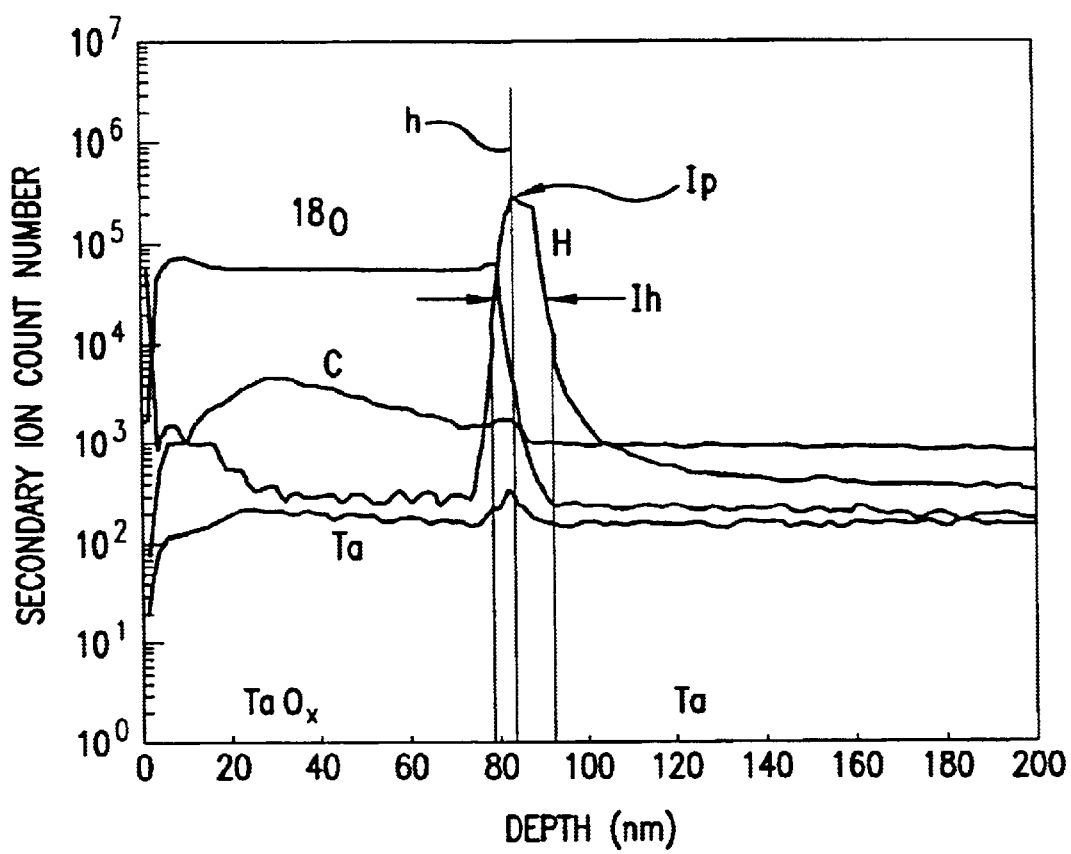
FIG. 8 shows a SIMS spectrum determined for an MIM type non-linear element relating to an example of the present invention.

FIG. 8 shows the results of SIMS by cesium ion etching, which was carried out to determine a profile of each of the elements ($^{18}O$, C, H and Ta) contained in the insulation film and the first conductive film. In FIG. 8, the depth from the surface of the insulation film in the first conductive film and the insulation film is shown on the horizontal axis, and the count number of secondary ions is shown in logarithmic scale on the vertical axis. In FIG. 8, a line shown by character "h" passes through the peak of the hydrogen spectrum, and shows the boundary between the first conductive film and the insulation film for convenience.

It was confirmed by FIG. 8 that in this example, the hydrogen spectrum of the boundary region between the first conductive film (Ta) and the insulation film ($TaO_x$) in the depth direction shows a relatively gentle peak having a bell-like form. The width at an intensity Ih of one tenth of the peak intensity Ip is about 17 nm. In SIMS measurement, if the anodized film (insulation film) of a sample is excessively thin, data of the boundary between the insulation film and the first conductive film is hardly obtained, and thus the thickness of the anodized film is set to about 70 nm. It was also confirmed that the boundary state of the anodized insulation film does not change regardless of change in the thickness of the anodized film.

Comparative Example 1

Figure 9:
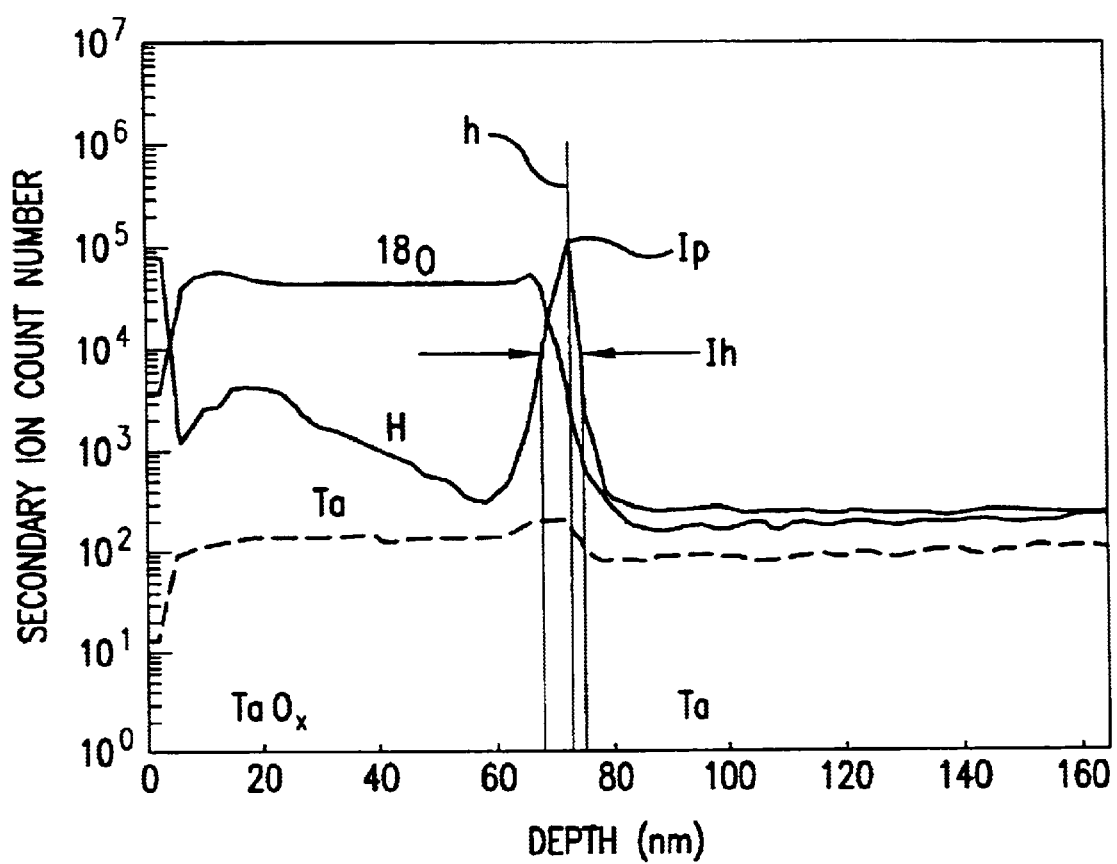
FIG. 9 shows a SIMS spectrum determined for an MIM type non-linear element relating to a comparative example of the present invention.

FIG. 9 shows the results of the same SIMS carried out for Comparative Example 1. It was confirmed by FIG. 9 that in this example, in a hydrogen spectrum of the boundary region between the first conductive film (Ta) and the insulation film ($TaO_x$) in the depth direction, the peak has an acute triangular shape, and the width at an intensity Ih of one tenth of the peak intensity Ip is about 7 nm.

Thermal dependency of the hydrogen peak:

In order to confirm what kind of influence the annealing temperature has on the hydrogen peak in SIMS, samples differing only in annealing temperature were prepared to obtain a spectrum according to SIMS. The samples were prepared the same way as in Example 1 except that the annealing temperature was set at 300° C. and 400° C. The SIMS spectrum obtained with these samples is shown in FIGS. 10 and 11, respectively.

Figure 10:
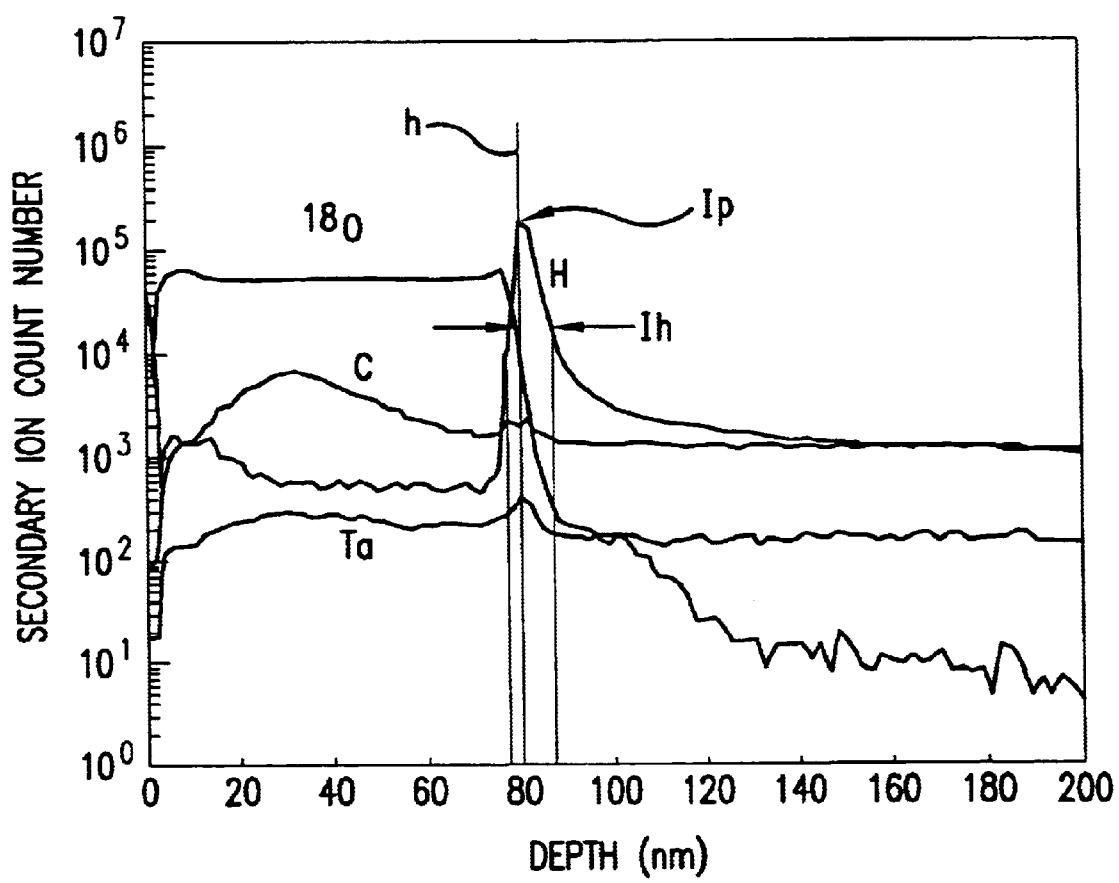
FIG. 10 shows a SIMS spectrum determined for an MIM type non-linear element relating to an example of the present invention.

FIG. 10 shows the spectrum of samples obtained with the annealing temperature set at 300° C. From FIG. 10, the hydrogen spectrum of these samples in this example was confirmed to have a width in the depth direction of approximately 12 nm at an intensity Ih of one tenth of the peak intensity Ip.

Figure 11:
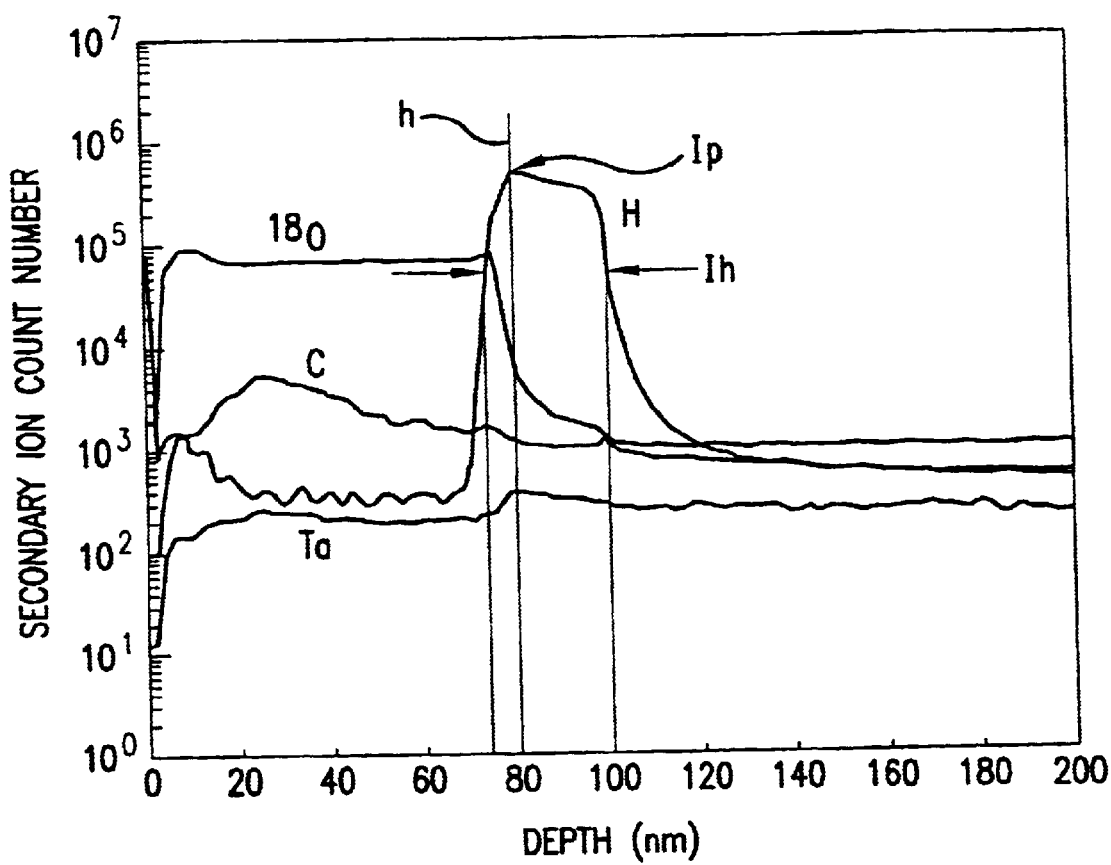
FIG. 11 shows a SIMS spectrum determined for an MIM type non-linear element relating to an example of the present invention.

FIG. 11 shows the spectrum of the samples obtained when the annealing temperature is set at 400° C. From FIG. 11, it is confirmed that in this example, the hydrogen spectrum of the samples has a width in the depth direction of approximately 23 nm at an intensity Ih of one tenth of the peak intensity Ip.

From FIGS. 8–11, it is confirmed that the hydrogen peak width increases with the rise in annealing temperature.
(b) Thermal Desorption Spectroscopy Example 1

Measurement of the first conductive film (Ta) by the thermal desorption spectral (TDS) method will be described below. This measurement was carried out by using the thermal desorption spectral measurement apparatus shown in FIG. 14.

Figure 14:
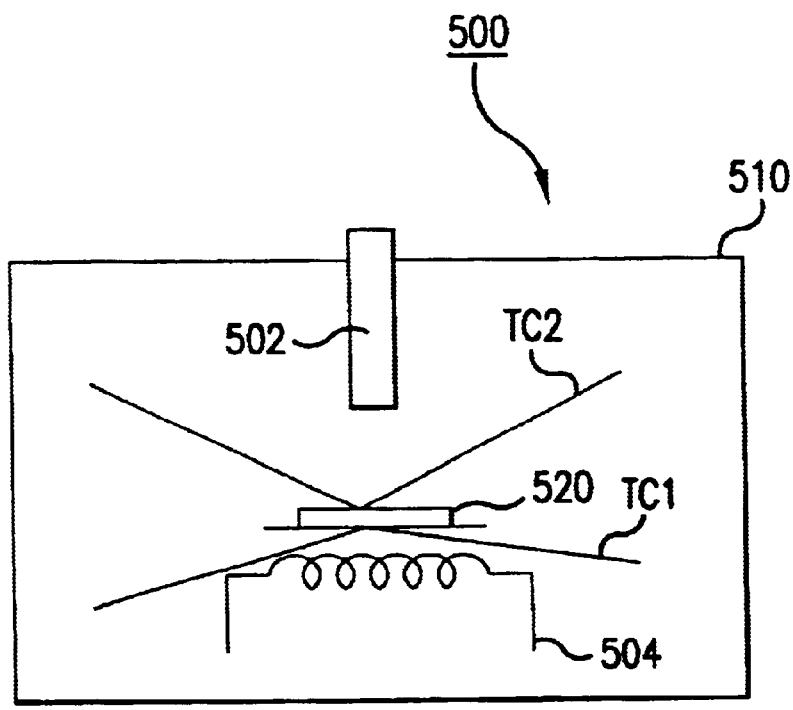
FIG. 14 shows in schematic an apparatus for determining the thermal desorption spectroscopy.
Figure 15:
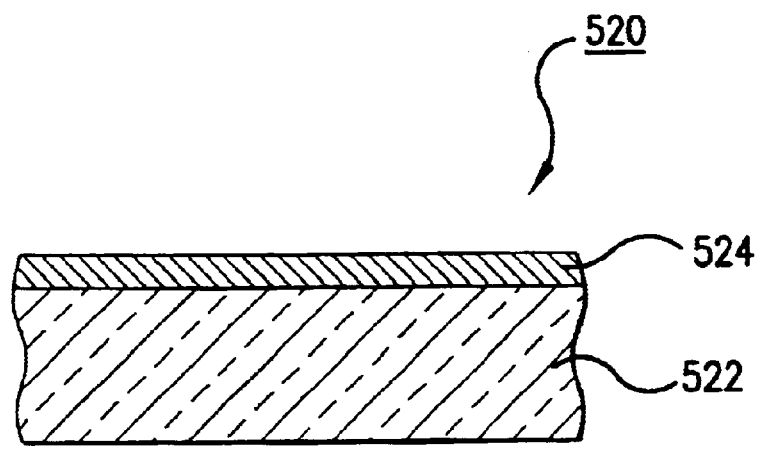
FIG. 15 shows in schematic a sample for obtaining the thermal desorption spectroscopy.

Referring to FIGS. 14 and 15, the thermal desorption spectral measurement apparatus 500 contains a quadrupole mass spectrometer 502 and an infrared heater 504 which are provided in a vacuum chamber 510. The back side of a sample 520 is heated by the infrared heater 504, and gases generated from the sample 520 are measured by the quadrupole mass spectrometer 502 to obtain a thermal desorption spectroscopy. The temperature of the sample was controlled by using a thermocouple TC1 on the back side of the sample 520 from the viewpoint of controllability. In order to measure the surface temperature of the sample 520, a thermocouple TC2 was also provided on the face side of the sample 520. The quartz substrate 522 used for the sample 520 was poor in thermal conductivity and had a thickness of as large as 1.1 mm, thereby causing a difference between the temperatures of the thermocouples TC1 and TC2. However, in the actual process for manufacturing a MIM type non-linear element, the temperature of the thermocouple TC1 is substantially the same as the temperature of the thermocouple TC2. In TDS measurement, quartz glass is used as a substrate. This is because the heat resistant temperature of the substrate is increased for measurement up to a high temperature of 1000° C. It is confirmed that even if the substrate is changed to a usual no-alkali glass, the current-voltage characteristics of the MIM type non-linear element are the same.

As shown in FIG. 15, the sample 520 used in measurement has a tantalum film 524 containing 0.2 atomic % of tungsten formed to a thickness of 200 nm on the quartz substrate 522 having a thickness of 1.1 mm. The tantalum film is formed on the quartz substrate by sputtering, and then subjected to the pre-annealing discussed above. Namely, the laminate shown in FIG. 15 was pre-annealed by heating to 350° C. in a nitrogen atmosphere and maintained at 350° C. for 30 minutes in a nitrogen atmosphere in a heat treatment furnace, and then cooled to 200° C. at a rate of 1.0° C./min. The laminate was then taken out from the heat treatment furnace and used as a sample for thermal desorption spectral measurement.

Figure 12:
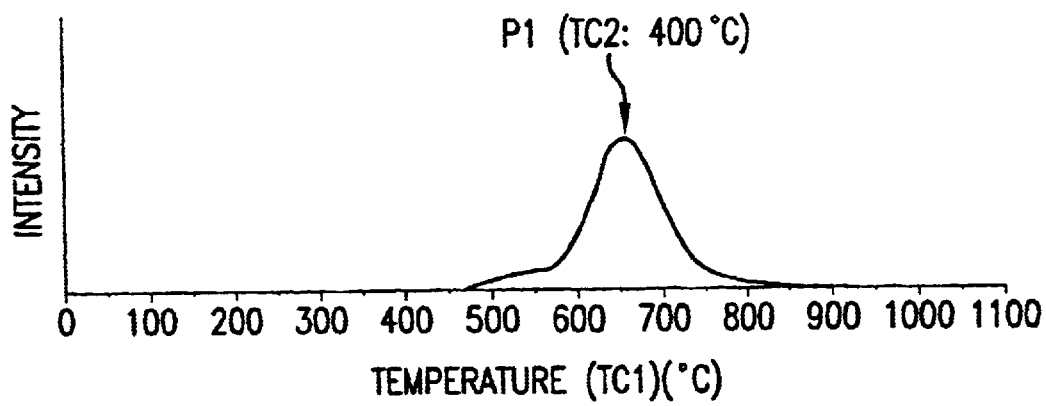
FIG. 12 shows a thermal desorption spectroscopy determined for a first conductive film of an MIM type non-linear element relating to an example of the present invention.

A thermal desorption spectroscopy was measured by using the sample 520. The results are shown in FIG. 12. In FIG. 12, the temperature of the control thermocouple TC1 is shown on the horizontal axis, and the intensity as the measured value of a gas at a molecular mass of 2 amu corresponding to hydrogen gas ($H_2$) is shown on the vertical axis. In the spectrum shown in FIG. 12, a peak P1 was obtained. As described above, since the temperature of the thermocouple TC1 is different from that of the thermocouple TC2, the surface temperature of the sample 520 at the peak P1 measured by the thermocouple TC2 was about 400° C. The lower limit temperature of the spectrum measured by the thermocouple TC2 was about 300° C.

Further, the number of hydrogen atoms determined by the integral intensity over the whole temperature region of the spectrum was $1.76 \times 10^{16}/cm^2$.

Comparative Example 1

Figure 13:
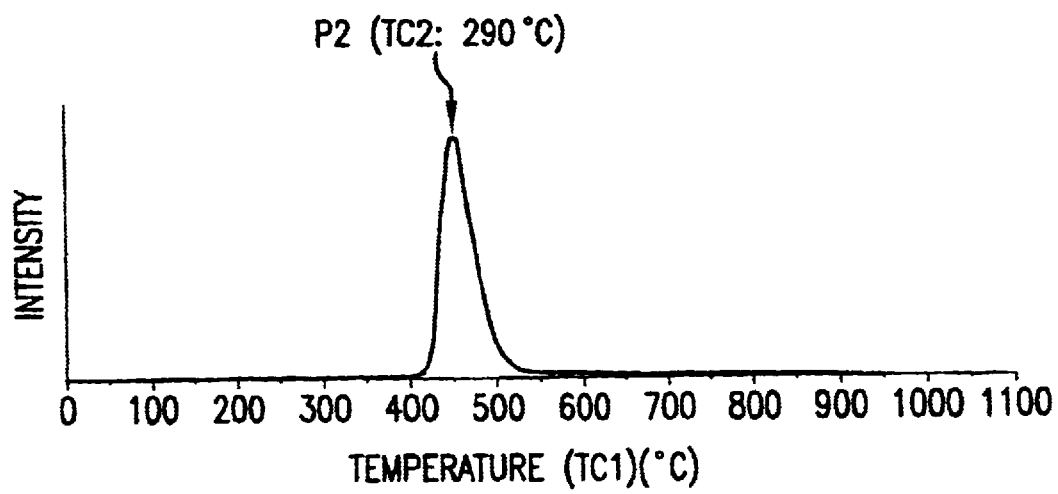
FIG. 13 shows a thermal desorption spectroscopy determined for a first conductive film of an MIM type non-linear element relating to a comparative example of the present invention.

Comparative Example 1 was examined. FIG. 13 shows the results of the same thermal desorption spectroscopy as Example 1. In the spectrum shown in FIG. 13, peak P2 was obtained. The temperature at peak P2 measured by the thermocouple TC2 was about 29020 C.

Further, the number of hydrogen atoms determined by the integral intensity over the whole temperature region of the spectrum was $1.16 \times 10^{16}/cm^2$.

(c) Shift Value

Example 1

In order to examine changes with respect to time in the current-voltage characteristics of the MIM type non-linear element of Example 1, a shift value as an index of changes was determined. As a result, the shift value was determined to be 2%. This shift value is defined as a value $I_s$ represented by the following equation when a rectangular wave voltage is applied to the MIM type non-linear element with the polarity changed at intervals of one second. At this time, the applied voltage is set so that a current of $1 \times 10^{-7}$ A flows through one pixel of the liquid crystal display panel.

$$I_s = \{(I_{100} - I_0)/I_0\} 100(\%)$$

In this equation, $I_0$ indicates the absolute value of the initial current (1 second), and $I_{100}$ indicates the absolute value of the current 100 seconds after. In practical use, in order to prevent image sticking, the shift value is preferably within the range of −5 to +5%, more preferably within the range of −2 to +2%.

Comparative Example 1

The shift value of Comparative Example 1 determined in the same manner as described above in Example 1 was 4%.

Pre-annealing dependency of the shift value:

A plurality of samples of the present invention which were pre-annealed, and a plurality of comparative samples which were not pre-annealed were further formed, and shift values of these samples were determined. The results obtained are shown in FIG. 16.

Figure 16:
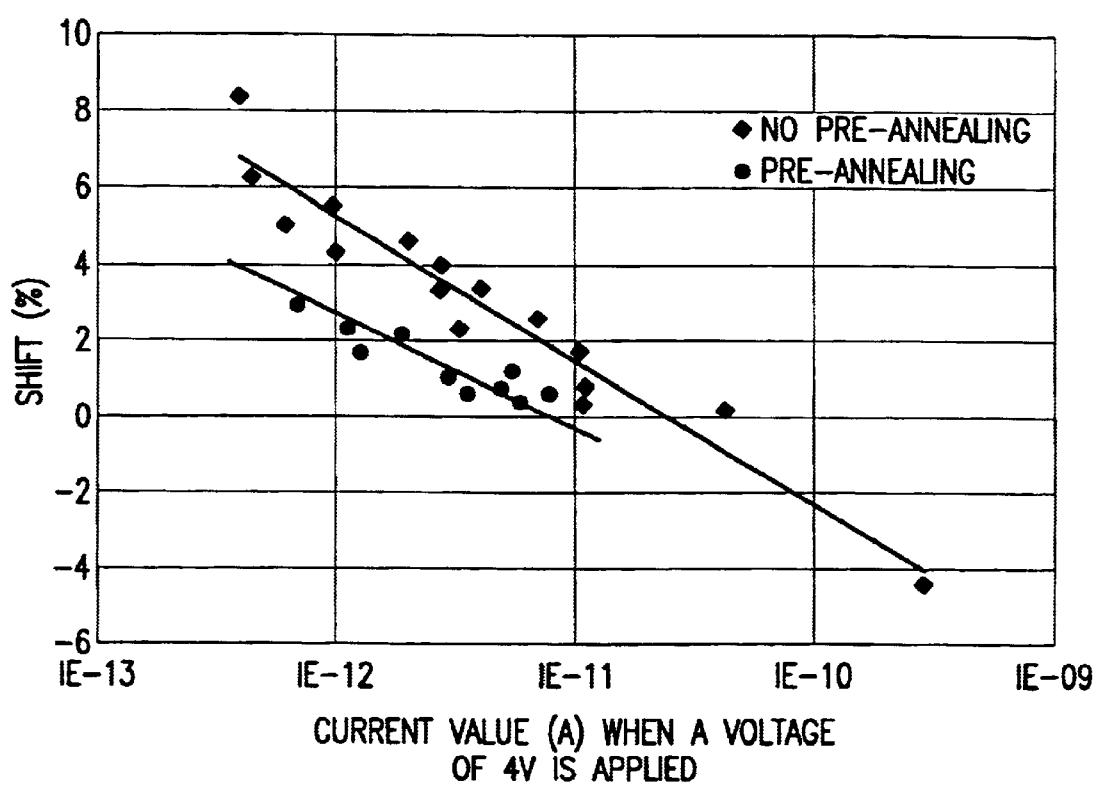
FIG. 16 shows the relationship between the current value and the shift value when a fixed voltage is applied to an MIM type non-linear element.

In FIG. 16, the logarithmic scale of the current passing through the MIM type non-linear element when a voltage of 4 V was applied is shown on the horizontal axis, and the shift value is shown on the vertical axis. It was clearly confirmed by FIG. 16 that both the shift value and the holding current required for obtaining a sufficient contrast are satisfied by pre-annealing. "The holding current required for obtaining a sufficient contrast" is a current value for preventing a signal input in the selection period from varying in a holding period. In regard to the holding current, the current flowing through the MIM type non-linear element is preferably $1 \times 10^{-11}$ A or less, more preferably $4 \times 10^{-12}$ A or less, for practical use, for example, when a voltage of 4 V is applied to the element.

(d) Non-linear Coefficient

Example 1

The current-voltage characteristics of the MIM type non-linear element of Example 1 were measured, and the non-linear coefficient (βvalue) indicating steepness was computed. As a result, the β value was 4.7.

Comparative Example 1

The β value of Comparative Example 1 determined in the same manner as Example 1 was 4.7.

(e) Relative Dielectric Constant

Example 1

The relative dielectric constant was determined from the electrostatic capacitance and the film width of the insulation film of an MIM type non-linear element. Specifically, the measurement of the electrostatic capacitance is determined by connecting 2,500 MIM type non-linear elements measuring 4 μm on each side, in parallel, and applying an alternating current having an effective voltage of 1 V and a frequency of 10 kHz. The electrostatic capacitance of the samples of the MIM type non-linear elements of Example 1 was 305 pF. Further, the film width of the insulation film measured using an ellipsometer was found to be 28.8 nm. Also, the relative dielectric constant of the insulation film, as computed from the electrostatic capacitance and film width obtained, was 24.8.

Comparative Example 1

The relative dielectric constant of Comparative Example 1 determined in the same manner as Example 1 was 25.7.

Figure 17:
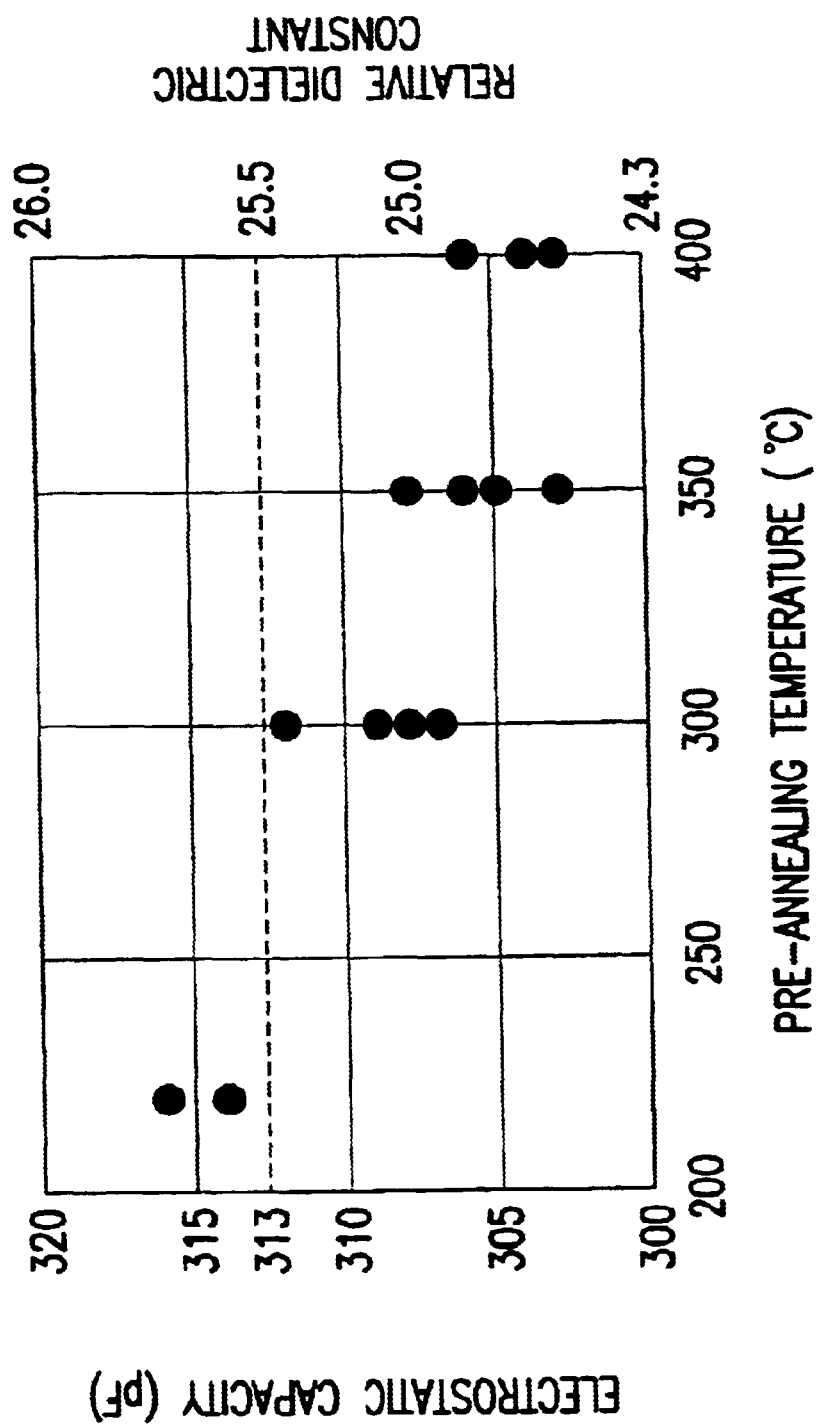
FIG. 17 shows the relationship between the pre-annealing temperature, the electrostatic capacitance and the relative dielectric constant, determined for an MIM type non-linear element.

Annealing temperature dependency of the relative dielectric constant:

In order to find the dependency of the annealing temperature of the relative dielectric constant, a plurality of samples were produced in which the pre-annealing temperature was altered. The electrostatic capacitance, and the relative dielectric constant computed from this electrostatic capacitance and the film width of the insulation film, were determined for these samples. These results are shown in FIG. 17. In FIG. 17, a plurality of points plotted on the same pre-annealing temperature correspond to the plurality of samples produced under identical conditions.

From FIG. 17, it can be understood that with a pre-annealing temperature of 300–400° C., the relative dielectric constant becomes approximately 24.5–25.5. Further, even if the pre-annealing temperature increases above 400° C., it was confirmed that the relative dielectric constant does not fall below 24.0.

(f) Temperature Dependency of Current Value

Example 1

Figure 18:
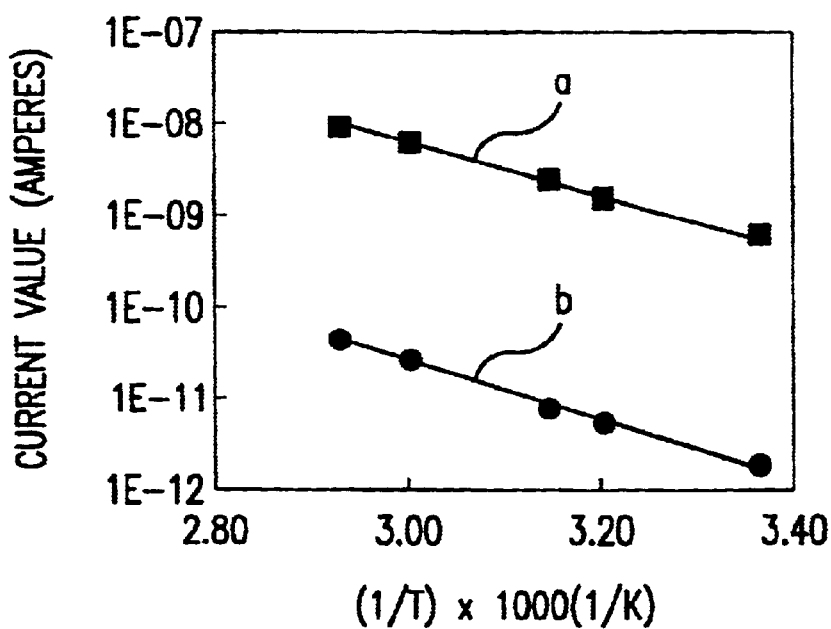
FIG. 18 shows the relationship between the temperature and the current value when a fixed voltage is applied to an MIM type non-linear element relating to an example of the present invention.

Using the samples obtained in Example 1, the current value flowing to the MIM type nonlinear elements was measured by changing the temperature of the substrate. The results are shown in the Arrhenius plotting of FIG. 18. In FIG. 18, the horizontal axis denotes the reciprocal ($(1/T) \times 1000$) of the absolute temperature, and the vertical axis denotes the current value. Also, the line denoted by symbol "a" is the data corresponding to a writing voltage when 10 volts is applied, and the line denoted by symbol "b" is the data corresponding to a writing voltage when 4 volts is applied.

When the slopes of line a and line b are determined by FIG. 18, they are found to be, respectively, −6.5792 and −7.3043, both of which are fairly close. As a result, because the temperature dependency of the current value has substantially the same inclination in writing voltage and holding voltage, deterioration of the on/off characteristic is confirmed to be slight.

Comparative Example 1

Figure 19:
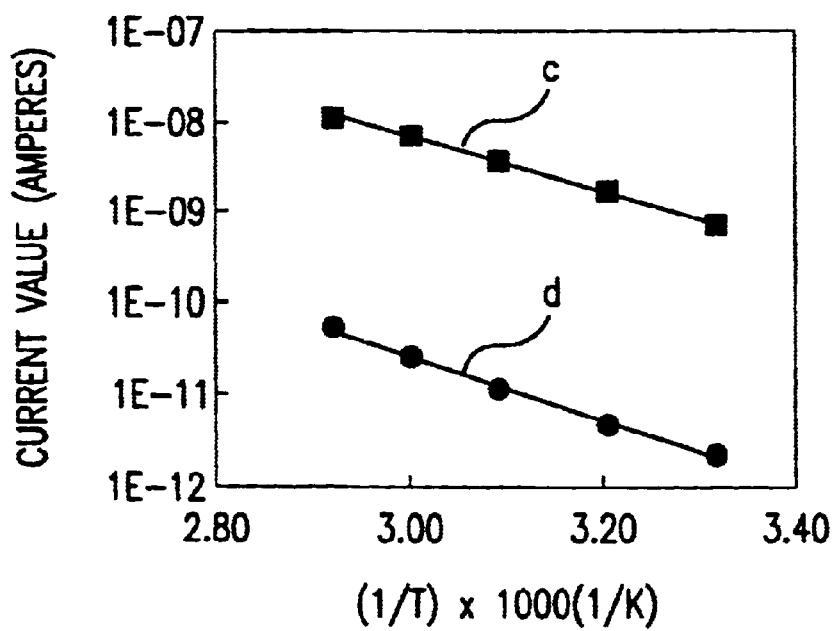
FIG. 19 shows the relationship between the temperature and the current value when a fixed voltage is applied to an MIM type non-linear element relating to a comparative example of the present invention.

Based on the samples obtained in Comparative Example 1, the temperature dependency of the current value was determined in the same manner as in Example 1. The results are shown in FIG. 19. In FIG. 19, the line denoted by symbol "c" is the data corresponding to the writing voltage when 10 volts is applied, and the line denoted by symbol "d" is the data corresponding to the holding voltage when 4 volts is applied.

When the slopes of lines c and d are determined in FIG. 19, they are found respectively to be −6.5066 and −7.7149. These are fairly different from each other as compared with Example 1. Therefore, it can be understood that when considering points such as the on/off characteristic, this is inferior to Example 1.

As a result of manufacture of a liquid crystal display panel by using the MIM type non-linear element of Example 1, a contrast ratio of 100:1 or more could be obtained, and no unevenness in the display was observed.

What is claimed is:

1. A two-terminal type non-linear element comprising a first conductive film, an insulating film, and a second conductive film which are laminated on a substrate, wherein elementary analysis is carried out by secondary ion-mass spectrography (SIMS) using irradiation of cesium primary ions, and wherein a hydrogen spectrum of a boundary region between the first conductive film and the insulation film is obtained having a width of 10 nm or more in a depth direction at an intensity of one tenth of a peak intensity.

2. A liquid crystal display panel comprising a first conductive film, an insulating film, and a second conductive film which are laminated on a substrate, wherein elementary analysis is carried out by secondary ion-mass spectrography (SIMS) using irradiation of cesium primary ions, and wherein a hydrogen spectrum of a boundary region between the first conductive film and the insulation film is obtained having a width of 10 nm or more in a depth direction at an intensity of one-tenth of a peak intensity.

* * * * *